United States Patent [19]
Davis

[11] Patent Number: 5,394,114
[45] Date of Patent: Feb. 28, 1995

[54] ONE NANOSECOND RESOLUTION PROGRAMMABLE WAVEFORM GENERATOR

[75] Inventor: Craig M. Davis, Puyallup, Wash.

[73] Assignee: National Semiconductor Corporation, Santa Clara, Calif.

[21] Appl. No.: 81,955

[22] Filed: Jun. 23, 1993

Related U.S. Application Data

[63] Continuation of Ser. No. 993,447, Dec. 16, 1992, abandoned, which is a continuation of Ser. No. 876,188, Apr. 30, 1992, abandoned.

[51] Int. Cl.[6] .......................... H03K 3/01; H03L 7/06
[52] U.S. Cl. ..................... 331/1 A; 331/57; 331/74; 327/116; 327/141; 327/175
[58] Field of Search ............. 328/59, 60, 62, 64, 328/66, 104; 307/365, 242, 262, 440, 465; 331/1 A, 45, 57, 74

[56] References Cited

U.S. PATENT DOCUMENTS

| | | | |
|---|---|---|---|
| 4,134,073 | 1/1979 | MacGregor | 328/62 |
| 4,197,506 | 4/1980 | Fogelstrom | 328/66 |
| 4,330,750 | 5/1982 | Mayor | 328/59 |
| 4,982,110 | 1/1991 | Yokogawa et al. | 328/109 |
| 5,059,924 | 10/1991 | Jennings | 331/57 |
| 5,204,555 | 4/1993 | Graham et al. | 307/465 |
| 5,262,735 | 11/1993 | Hashimoto et al. | 331/45 |

OTHER PUBLICATIONS

National Semiconductor Preliminary Data Sheet titled CGS500 Programmable Timing Manager, Sep. 1991, 14 unnumbered pages. A Jul. 1991 and the Sep. 1991 Preliminary Data Sheets were distributed outside of National only with non-disclosure agreements.

Gazelle Microcircuits, Inc. Data Sheet titled GA1110 Multi-Phase Clock Generator Low-Skew TTl Clock Buffer, pp. 1–2 (no date, no author).

Gazelle Microcircuits, Inc. Data Sheet titled GA1210 Los-Skew TTL Clock Doubler Two-Phase Clock Generator, pp. 1–2 (no date, no author).

Ron Wilson, *Creative Use of PLLs Solves Clock Skew Problem*, Sep. 1, 1990, Computer Design, pp. 40–42.

Deog-Kyoon Jeong et al., *Design of PLL-Based Clock Generation Circuits*, Apr. 1987, Journal of Solid State Circuits, vol. 22, pp. 255–261.

Primary Examiner—David Mis
Attorney, Agent, or Firm—Limbach & Limbach

[57] ABSTRACT

Generation of clock waveforms which have a frequency, phase offset, and duty cycle that is relative to a periodic reference signal. The outputs of a voltage controlled ring oscillator are directly applied to drive the inputs of a programmable AND, fixed OR array (PAL) to produce pulses of varied and phase offset and duty cycle. The phase offset has a resolution of one nanosecond. Additionally, the pulses generated can be ORed together within the PAL to produce clock waveforms that are multiples of the input frequency.

46 Claims, 5 Drawing Sheets

| REFIN FREQUENCY | Q1-Q6 RANGE | TRANSITION RESOLUTION | LOOP GATE COUNT |
| --- | --- | --- | --- |
| 10 MHz | 10 to 100 MHz | 2.0 ns | 51 |
| 20 MHz | 20 to 100 MHz | 0.98 ns | 51 |
| 25 MHz | 25 to 100 MHz | 1.03 ns | 39 |
| 33 MHz | 33 to 99 MHz | 1.12 ns | 27 |
| 50 MHz | 50 to 100 MHz | 0.95 ns | 21 |

FIG. 5

ONE NANOSECOND RESOLUTION PROGRAMMABLE WAVEFORM GENERATOR

This is a continuation of application Ser. No. 07/993,447, filed Dec. 16, 1992, now abandoned which is a continuation of Ser. No. 07/876,188, filed on Apr. 30, 1992, now abandoned.

BACKGROUND OF THE INVENTION

1. Field of the Invention

The present invention relates to programmable waveform generators and, in particular, to waveforms which are derived from a periodic reference signal.

2. Description of the Related Art

The events occurring within many integrated circuits are referenced to a periodic clock signal. Frequently, it is desirable to synchronize the events occurring within several integrated circuits so that related events can occur at the same time. One method of synchronizing interchip timing is to distribute the same clock signal to each of the integrated circuits.

In a typical application, however, it is unlikely that the same clock signal will synchronously trigger events in several integrated circuits because of differing electrical path lengths, capacitive variations, and temperature variations. Because of these differences, a simultaneous event may be triggered in one integrated circuit several nanoseconds before it's corresponding event is triggered in a second integrated circuit.

The solution to this problem has been to delay the clock signals sent to the earlier triggering integrated circuits. For example, if a periodic clock signal triggers a first integrated circuit in five nanoseconds and a second integrated circuit in six nanoseconds, substantial synchronization can be achieved by passing the clock signal transmitted to the first integrated circuit through a discrete component which has a one nanosecond delay. Thus, the periodic clock signal may trigger events within the first and second integrated circuits at approximately six nanoseconds.

Often, however, it is not practical to implement the above solution using discrete components because the specified delay tolerance is too large. The process of individually testing each component to determine the actual delay time and then matching it to a delay circuit makes this approach unsuitable for high volume manufacturing procedures. Additionally, discrete components are also unsuited because of the large amount of board space they require.

A second implementation of this solution, as discussed in "Design of PLL-Based Clock Generation Circuits", *J. Solid-State Circuits*, Vol. SC-22, No. 2, April 1987, utilizes a voltage controlled oscillator, a nine gate ring oscillator, and AND gates configured as a phase locked loop. By logically ANDing the outputs from the ring oscillator, four clock signals, with approximately a 40 nanosecond phase delay between clock signals, were produced.

A third implementation, as discussed in *Computer Design*, Pg. 40, Sep. 1, 1990, uses a 160 megahertz (MHz) gallium arsenide voltage controlled oscillator and a digital delay line configured as a phase locked loop, to produce clock signals with approximately a 2 ns phase delay between different clock signals.

Although both implementations provide methods for achieving phase delays, the rapidly increasing speeds that computer systems may operate under make it desirable to reduce the phase shift resolution below 2 ns. In addition, one problem with the third implementation is that gallium arsenide fabrication is much more expensive than standard silicon processing. Thus, there is a need to produce a clock signal, using silicon fabrication, which tracks the reference clock signal with a forward or backward phase shift resolution of less than 2 ns.

In addition to phase shifting a clock signal to simultaneously trigger events in multiple integrated circuits, it is frequently desirable to produce frequency multiplied clock signals. One example of where frequency multiplication is desirable is interboard clock signal transmission. For example, if a 40 MHz signal is to be synchronously used on different boards, significant capacitive problems may be avoided if a 10 or 20 MHz signal is first transmitted to the outlying boards and then multiplied back up to the original 40 MHz signal frequency.

One method of multiplying a frequency, as discussed in *Computer Design*, Pg. 40, Sep. 1, 1990, has been to use a voltage controlled oscillator and a counter chain configured as a phase locked loop. In this implementation, the frequency of an original clock signal is divided in half and then transmitted to a second board. At the second board, the voltage controlled oscillator produces the original clock signal frequency. The signal at the second board is then synchronized to the first board by dividing the signal at the second board and using the phase locked loop to track the two divided signals.

A variation of the above frequency division method, as discussed in *Computer Design*, Pg. 40, Sep. 1, 1990, has been to use a 160 MHz gallium arsenide voltage controlled oscillator. By using a voltage controlled oscillator which runs at such a high frequency, the 160 MHz signal may be divided down several times to produce frequencies which are up to eight times the input frequency. As stated above, one problem with gallium arsenide is the increased cost of using this medium.

Thus, there is a need to provide a method and apparatus for forming a clock signal in a manner that would solve the above identified problems.

SUMMARY OF THE INVENTION

In accordance with the present invention, a circuit and a method are disclosed which produce clock signals by first generating a periodic voltage signal in response to an error signal. Next, a plurality of phase-delayed periodic voltage signals are produced in response to the periodic voltage signal so that the phase-delayed periodic voltage signals have an equally-spaced phase relationship. Next, a plurality of ANDed signals are formed by logically ANDing one or more of the phase-delayed periodic voltage signals together. Following this, one or more of the ANDed signals may be selected as an output clock signal. One of the output clock signals is then selected to be a feedback signal. The feedback signal and a reference signal are phase compared to produce the error signal.

Other features and advantages of the present invention will become apparent and be appreciated by referring to the following detailed description of the invention considered in conjunction with the accompanying drawings.

BRIEF DESCRIPTION OF THE DRAWINGS

FIG. 5 is a table that illustrates the approximate delay gate to delay gate resolution of an output signal in terms of the input signal.

DETAILED DESCRIPTION

Figure 1:
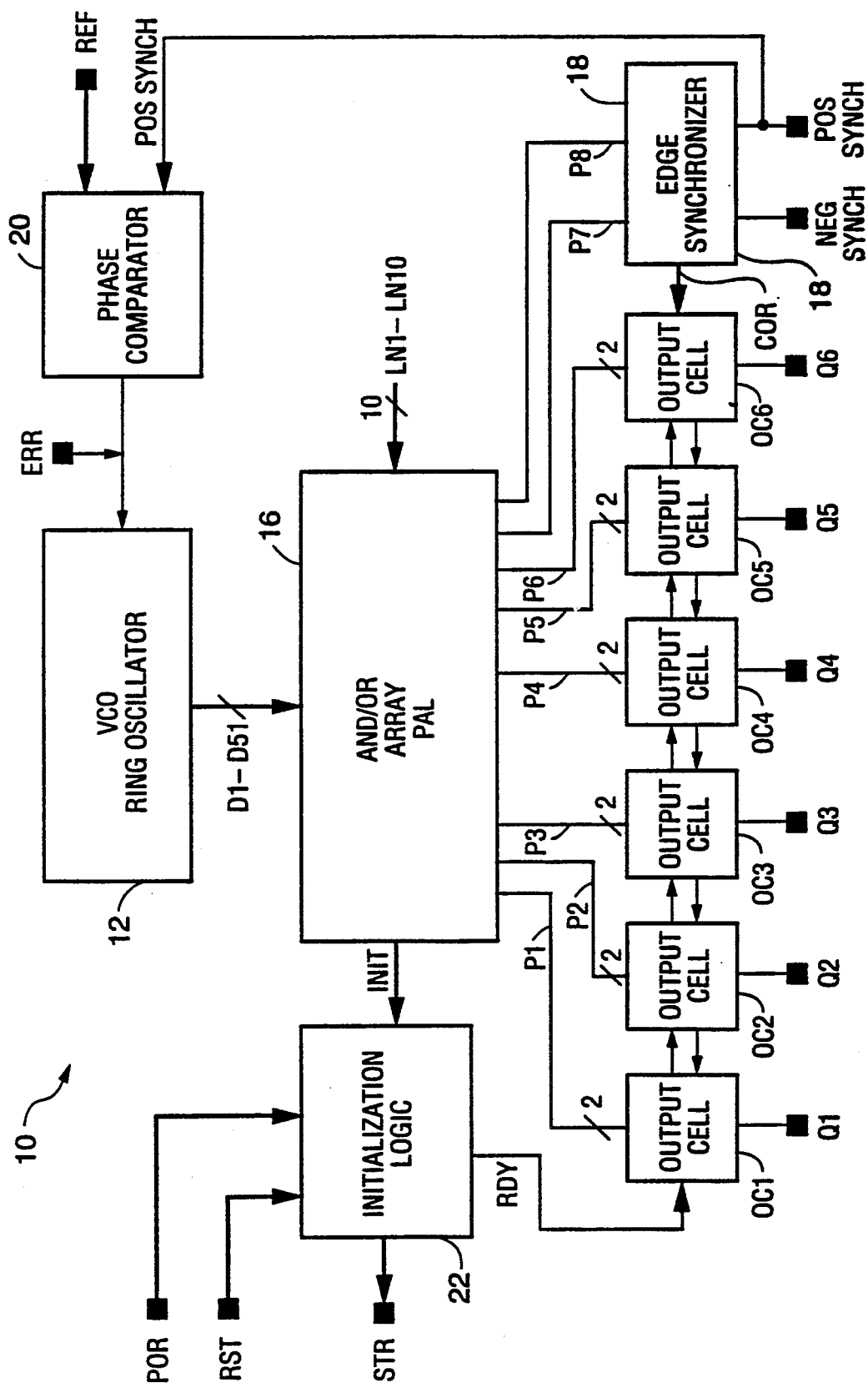
FIG. 1 is a block diagram illustrating a programmable waveform generator in accordance with the present invention.

FIG. 1 shows a programmable waveform generator 10 that includes a voltage controlled oscillator (VCO) 12, a programmable AND/fixed OR logic array (PAL) 16, six equivalent output cells OC1-OC6, an edge synchronizer 18, a phase comparator 20, and initialization logic 22. These elements enable the waveform generator 10 to be programmed to receive a stable CMOS or TTL input reference signal REF and generate six clock driver output signals Q1-Q6 which have a frequency, phase shift and duty cycle which are relative to the input reference signal REF.

Figure 2:
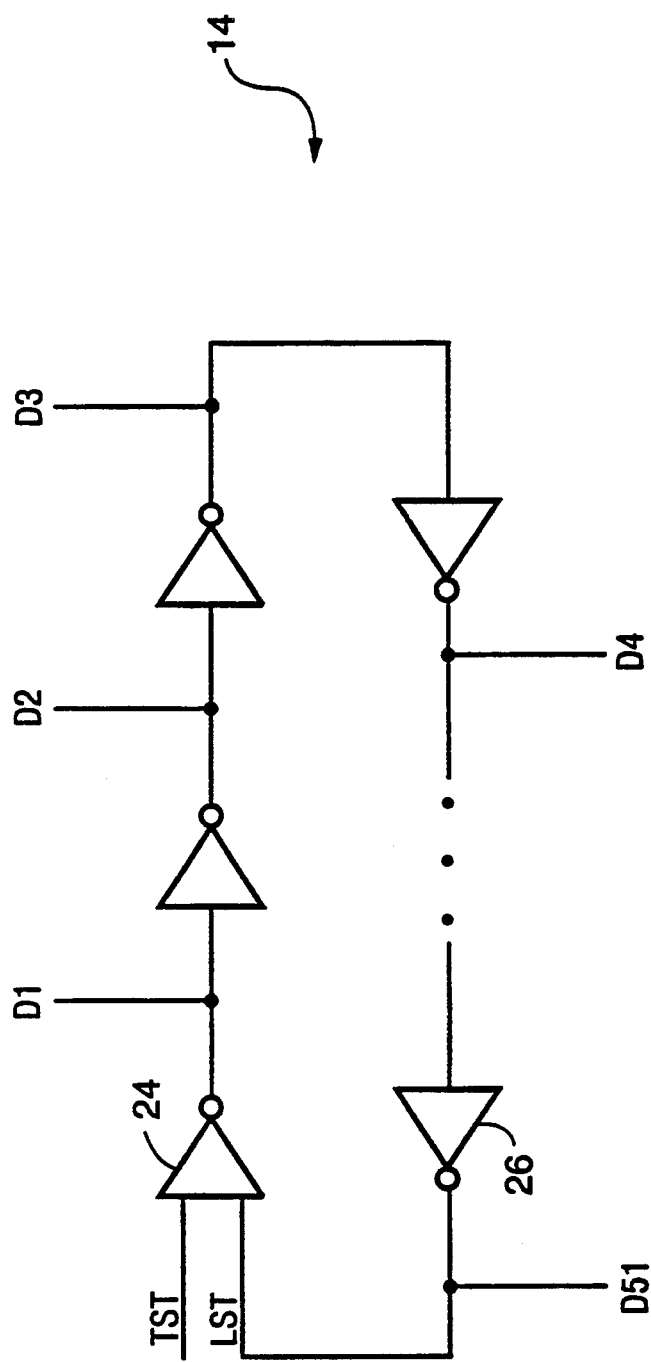
FIG. 2 is a block diagram illustrating a ring oscillator in accordance with the present invention.

The VCO 12 is comprised of a string of gates electrically coupled to form a ring oscillator 14 as shown in FIG. 2. The first gate 24 of the ring oscillator 14 has two inputs; one input for receiving a test signal TST for disabling the ring oscillator 14 for testing, and the other input for receiving the output signal LST from the last gate 26. Each gate in the ring oscillator 14 has an equivalent delay with the number of total delays being substantially equivalent to the period of the input reference signal. The output signal LST, which represents the time it takes the signal to feed back onto itself, is voltage controlled so that the period of oscillation will be equal to the period of the input reference signal REF.

In the preferred embodiment of the present invention, the ring oscillator 14 has 51 gates. The output of each of the gates is electrically coupled to the PAL 16 so that the VCO 12 transmitts 51 different ring oscillator signals D1-D51 to the PAL 16.

Each of the ring oscillator signals D1-D51 is representative of the output signal LST with a different, but equal, phase delay. For example, signal D1 represents the output signal LST with an n second delay while signal D3 represents the output signal LST, but with a 2 n second phase delay.

The ring oscillator 14 must propagate a signal transition onto itself twice to complete an equivalent period equal to the input reference signal REF. Any given signal output in the ring oscillator 14 will propagate a one transition back around followed by a zero transition. Therefore, each of the ring oscillator signals D1-D51 will have a designated rising and falling phase transition placement or offset spread substantially equally across the period of the input reference signal REF. The placement will be substantially equally-spaced because of switching threshold variations that inherently exist between the gates. The rising transition of signals D1 and D3 may be as close as one ns apart. The rising transition of signal D2 will be one-half a period offset from that of signals D1 and D3 due to the inversion between the gates.

The phase delay or resolution (n second) between every other ring oscillator signal D1-D51 is determined by dividing the period of the input reference signal REF by the number of gates in the ring oscillator 14. To obtain greater flexibility, the number of gates in the ring oscillator 14 may be selected to be 21, 27, 39, or 51 gates. The selection of the number of gates to use is determined by the frequency of the input reference signal REF and the desired phase delay between every other ring oscillator signal D1-D51. As shown in FIG. 5, a phase delay between every other ring oscillator signal D1-D51 of approximately one nanosecond (ns) can be realized.

Figure 3:
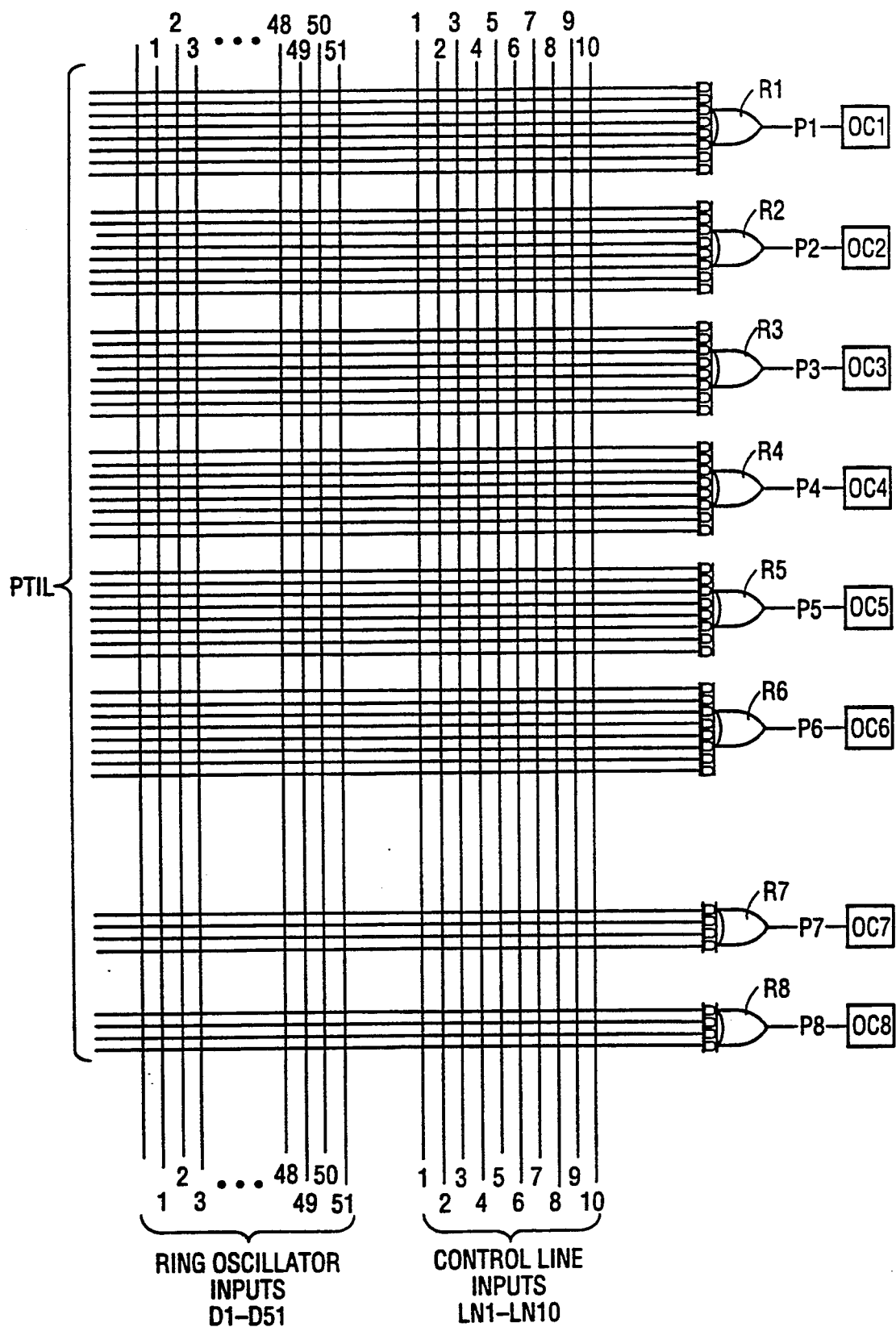
FIG. 3 is a wiring diagram illustrating an embodiment of a programmable AND/fixed OR logic array.

As stated above, the ring oscillator 14 transmits the ring oscillator signals D1-D51 to the PAL 16. Referring to FIG. 3, the PAL 16 includes eight logical OR gates R1-R8 which are used for waveform generation and internal timing. The waveform OR gates R1-R6, which are used to generate the clock driver output signals Q1-Q6, each have eight input lines known as product term input lines PTIL. Each waveform OR gate is electrically coupled to one output cell so that the PAL 16 can transmit waveform signals P1-P6 from the waveform OR gates R1-R6 to the output cells OC-1-OC6, respectively.

Similarly, the timing OR gates R7-R8, which are used for internal timing functions, each have four product term input lines PTIL. The outputs of the timing OR gates R7-R8 are electrically coupled to the edge synchronizer 18 so that the timing OR gates R7-R8 can transmit timing signals P7-P8, respectively, to the edge synchronizer 18.

As shown in FIG. 3, each product term input line PTIL of each of the OR gates R1-R8 is electrically coupled to the output of each gate of the ring oscillator 14 so that each of the product term input lines PTIL may receive each of the ring oscillator signals D1-D51.

The effect of having two ring oscillator signals present on one product term input line PTIL is the logical ANDing of the signals present. By logically ANDing two of the ring oscillator signals D1-D51 together, an anded signal AD may be produced which has a frequency which matches the input reference signal REF, but which has a phase shift and duty cycle which varies as a function of which two of the ring oscillator signals D1-D51 have been logically ANDed together. In addition, since the ring oscillator 14 may be configured to generate ring oscillator signals D1-D51 with a signal to signal delay of approximately one ns, the phase shift and duty cycle of the anded signal AD may be controlled by one ns increments. Each of the product term input lines PTIL may be configured to accept any two of the ring oscillator signals D1-D51 by following conventional PAL programming steps.

Figure 4:
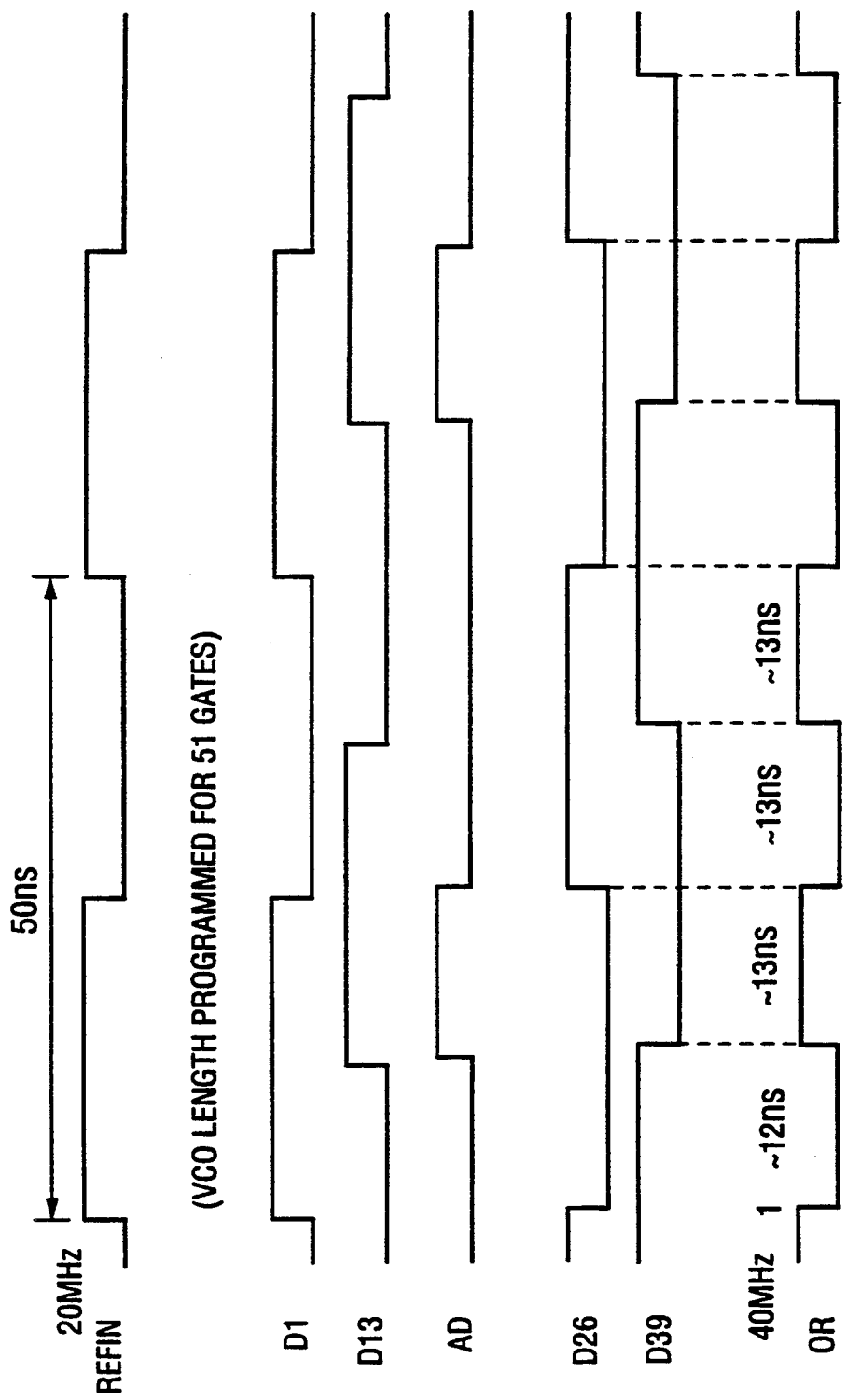
FIG. 4 is a timing diagram illustrating, in relation to an input signal, a signal having a phase shift and a 25% duty cycle and a signal having a frequency which is twice the frequency of the input signal.

For example, if only the D1 and D13 signals were present on one product term input line PTIL, the resulting anded signal AD would be a signal which represents the logical ANDing of the D1 and D13 signals. Referring to FIG. 4, a 20 MHz input reference signal, a D1 signal, a D13 signal, and a resulting ANDed signal AD are shown. FIG. 4 illustrates that the resulting ANDed signal AD matches the frequency of the 20 MHz input reference signal with approximately a 12.5 ns phase delay and a 25% duty cycle pulse.

As stated above, each of the waveform OR gates R1-R6 has eight product term input lines PTIL. Thus, each of the waveform OR gates R1-R6 may have eight combinations of logically ANDed signals (if two of the D1-D51 signals are present on one product term input line PTIL) or single signals (if only one of the D1-D51 signals is present). In a similar fashion, each of the timing OR gates R7-R8 may have any combination of logically ANDed signals on each of their four product term input lines PTIL. In the preferred embodiment of the present invention, however, the four product term input lines PTIL are limited to single ring oscillator signals D1–D51 because the timing OR gates R7–R8 are used for internal timing functions.

The selection between the eight product term input lines PTIL of the waveform OR gates R1–R6 and four product term input lines PTIL of the timing OR gates R7–R8 is accomplished with 10 control lines LN1–LN10. Each of the 10 control lines LN1–LN10 is electrically coupled to each of the product term input lines PTIL in the same way that each of the gate outputs of the ring oscillator 14 are. Thus, by asserting the appropriate control lines, any one product term input line PTIL of the eight may be selected. By selecting one of the product term input lines PTIL, the logically ANDed signal or single ring oscillator signal D1–D51 present on that line will be output from the OR gate.

By selecting two or more of the product term input lines PTIL, a signal may be generated which has a frequency which is a multiple of the input reference signal REF frequency. Returning to the previous example, assuming one product term input line PTIL represents the logical ANDing of the D1 and D13 signals and that a separate product term input line PTIL of the same OR gate represents the logical ANDing of the D26 and D39 signals, then when the D1/D13 and D26/D39 signals are logically ORed together, the resulting signal will be a multiple of the input reference signal REF.

Referring to FIG. 4, a 20 MHz input reference signal, a D1 signal, a D13 signal, a D26 signal, a D39 signal and a resulting ORed signal OR are shown. FIG. 4 illustrates that the ORed signal OR is double the clock frequency of the 20 MHz input reference signal REF. Each additional ANDed signal that is logically ORed together increases the rate of multiplication by one. The maximum possible frequency multiplication rate is eight, corresponding to the number of product term input lines PTIL within each of the waveform OR gates R1–R6.

The selection between the eight product terms trades off frequency multiplication for waveform options. For example, all eight signals present on the eight product term input lines may be logically ORed to achieve an 8× multiplication or two waveform selections at a 4× multiplication can be realized.

In addition to selecting between the product term input lines PTIL, the control lines LN1–LN10 may be used to gate any combination of the signals present on the eight product term input lines PTIL. For example, if the appropriate control lines are selected, the waveform signals P1–P6 may be totally inhibited or limited to a single pulse.

Referring to FIG. 1, as discussed above, the PAL 16 transmits the waveform signals P1–P6 to the output cells OC1–OC6, respectively, which in turn, output the clock driver output signals Q1–Q6. Each of the output cells OC1–OC6, in addition to receiving the waveform signal from the PAL 16, also receives a correction signal COR from the edge synchronizer 18 (see below) and a ready signal RDY from the initialization logic (see below). Additionally, the PAL 16 also transmits the timing signals P7–P8 to the edge synchronizer 18.

The edge synchronizer 18, which includes a phase comparator and a delay line loop, is electrically coupled to the phase comparator 20 and each of the output cells OC1–OC6 to perform two internal timing operations. First, the edge synchronizer 18 is used to complete a phase locked loop which synchronizes the edge synchronizer output signal POSSYNCH, which represents the input timing signal P8, and the input reference signal REF. By synchronizing the edge synchronizer output signal POSSYNCH and the input reference signal REF, a fixed timing relationship between the clock driver output signals Q1–Q6 and the input reference signal REF can be maintained. Second, the edge synchronizer 18 is used to maintain the timing between the rising and falling edges of the clock driver output signals Q1–Q6.

The edge synchronizer output signal POSSYNCH and the input reference signal REF are synchronized by transmitting the edge synchronizer output signal POSSYNCH to the phase comparator 20. The edge synchronizer output signal POSSYNCH functions as a feedback signal which forms the phase locked loop. The phase comparator 20 accepts both the edge synchronizer output signal POSSYNCH and the input reference signal REF and then outputs an error signal ERR to the VCO 12.

The error signal ERR, which is in proportion to the phase difference between the rising edges of the edge synchronizer output signal POSSYNCH and the input reference signal REF, is then filtered by the VCO 12 to control the ring oscillator signals D1–D51. When the edge synchronizer output signal POSSYNCH and the input reference signal REF are synchronized, the error signal ERR transmitted from the phase comparator 20 will no longer adjust the ring oscillator signals D1–D51. When this occurs the phase locked loop is said to be locked. The advantage of using a phase locked loop is that the edge synchronizer output signal POSSYNCH can track any changes in the input reference signal REF.

With the edge synchronizer output signal POSSYNCH synchronized to the input reference signal REF, a fixed timing relationship between the clock driver output signals Q1–Q6 and the input reference signal REF may be established by using substantially equivalent electrical pathways from the output of each gate of the ring oscillator 14 to the outputs of the output cells OC1–OC6 and the edge synchronizer 18. An equivalent electrical pathway includes an electrical path of substantially the same length which passes through the same number of logic gates having substantially equivalent delay times.

For example, if the phase difference between signal D1 and D13 is 13 ns at the ring oscillator 14, the difference between D1 and D13 and the output of the output cells OC1–OC6 or the edge synchronizer 18 will remain 13 ns if each signal follows an electrical path of the same length and passes through the same number of logic gates. Thus, if the D13 signal is selected as the POSSYNCH signal and the D1 signal is selected as the Q1 signal, the Q1 signal will continue to lead the input reference signal REF by 13 ns.

The edge synchronizer output signal POSSYNCH may be any of the ring oscillator signals D1–D51. This allows the waveform generator 10 to generate output clock driver signals Q1–Q6 that are phase shifted forward of the input reference signal REF, as shown in the previous example, as well as phase shifted backward.

The edge synchronizer 18 also compensates for any differences in the propagation delay time that rising edges and falling edges experience after propagating through the gates within the VCO 12, the ring oscillator 14, and the PAL 16. The edge synchronizer 18 compensates for propagation delay time by comparing the timing signals P7–P8.

The P7 timing signal is matched to the P8 timing signal and is always one ring oscillator signal ahead of the P8 timing signal. For example, if the P8 timing signal represents the D5 signal, the P7 timing signal must represent the D4 signal. The edge synchronizer 18 measures the time between the falling edge of the P7 timing signal (D4 in the example) and the rising edge of the P8 timing signal (D5 in the example).

The edge synchronizer 18 then transmits the correction signal COR, which is relative to the phase difference between the falling and rising edges of the P7 and P8 timing signals, to each of the output cells OC1–OC6. The correction signal COR injects or removes current from a path in each of the output cells OC1–OC6 which propagates negative edges only to increase or decrease the timing of the onset of the falling edge.

As shown in FIG. 1, the edge synchronizer outputs the POSSYNCH and NEGSYNCH signals. As stated above, the POSSYNCH signal represents the P8 timing signal whereas the NEGSYNCH signal represents the P7 timing signal. Although the primary utilization of these two signals is to implement internal timing functions, the signals are also presented as additional clock driver signals for added flexibility.

The initialization logic 20 allows the waveform generator 10 to be reset by a power on signal POR or a reset signal RST. The power on signal POR freezes the output states of the clock driver output signals Q1–Q6 to user defined levels for approximately 200 microseconds. Following the timeout, the initialization logic 20 transmits the ready signal RDY to each of the output cells OC1–OC6 which then releases the output cells OC1–OC6 to transmit whatever signal is present. The user defined states are set following standard configuration steps of the PAL 16.

The reset signal RST also freezes the output states of the clock driver output signals Q1–Q6 to user defined levels when ever the reset signal RST line goes active. For the reset signal RST, however, the output cells are not released until the initialization logic receives an initialization signal INIT transmitted from the PAL 16. When the initialization signal INIT is received, the initialization logic 20 transmits the ready signal RDY to the output cells OC1–OC6 and further transmits a strobe signal STR. The strobe signal STR is used to mark the valid starting point of the clock driver output signals Q1–Q6 for other devices. The initialization signal INIT is formed much like waveform signals P1–P6 and the timing signals P7–P8.

Producing clock driver output signals Q1–Q6 using the waveform generator 10 of the present invention has several advantages. First, by logically ANDing together the appropriate ring oscillator signals D1–D51, the user may program each of the clock driver output signals Q1–Q6 to have a different phase delay in relation to the input reference signal REF, to a resolution of one nanosecond. In addition, the duty cycle of each of the clock driver output signals Q1–Q6 may be defined to be equal to or less than the input reference signal REF to a resolution of one ns.

Second, because any four of the ring oscillator signals D1–D51 may be utilized as the edge synchronizer output signal POSSYNCH, the clock driver output signals Q1–Q6 may be phase advanced as well as phase delayed.

Third, by logically ORing together selected product term input lines, the user may program each of the clock driver output signals Q1–Q6 to have a frequency which is a multiple of the frequency of the input reference signal REF.

Fourth, by using a programmable AND/fixed OR array to implement the logical ANDing and ORing functions of the present invention, the time delay variation that is present when discrete components are used is substantially eliminated. In addition, the programmable AND/fixed OR array provides the designer with substantial design flexibility.

Fifth, by utilizing a selectable number of gates in the ring oscillator 14, a one nanosecond resolution may be maintained over an input frequency of approximately 20 MHz to 50 MHz.

It should be understood that various alternatives to the structures described herein may be employed in practicing the present invention. It is intended that the following claims define the invention and that the structure within the scope of these claims and their equivalents be covered thereby.

What is claimed is:

1. A circuit for generating a high-resolution periodic waveform, comprising:
   oscillator means for generating a plurality of delayed oscillator signals in response to an error signal;
   a plurality of ANDing means for generating a plurality of clock signals so that each ANDing means generates one clock signal, each ANDing means comprising:
     receiving means for receiving the plurality of delayed oscillator signals, and
     generating means for generating a clock signal from the delayed oscillator signals received by the receiving means by passing a single delayed oscillator signal, and by performing a logical AND operation on two or more delayed oscillator signals;
   a plurality of driver means for generating a plurality of clock driver output signals so that each driver means generates one clock driver output signal, each driver means comprising:
     means for receiving one clock signal, and
     means for generating a clock driver output signal in response to said one clock signal;
   feedback means for feeding back one of the clock driver output signals as a feedback signal; and
   comparison means for generating the error signal by comparing the feedback signal and a reference signal.

2. The circuit of claim 1 wherein the oscillator means comprises a voltage controlled ring oscillator having a ring of gates, each gate corresponding to one of the plurality of delayed oscillator signals.

3. The circuit of claim 2 wherein the phase delay between each adjoining gate in the ring of gates is substantially equivalent.

4. The circuit of claim 2 wherein the plurality of ANDing means comprises a logic array.

5. The circuit of claim 3 wherein the plurality of delayed oscillator signals includes 51, 39, 27, or 21 delayed oscillator signals.

6. The circuit of claim 4 wherein the logic array includes a fixed AND/OR logic array.

7. The circuit of claim 3 wherein the phase delay between each gate is determined by the number of gates in the ring and the frequency of the reference signal.

8. The circuit of claim 7 wherein the number of gates in the ring includes any number of odd gates.

9. The circuit of claim 1 wherein one of the driver means further includes:
   means for comparing a rising edge of one clock signal with a falling edge of another clock signal; and
   means for adjusting a propagation delay of the remaining driver means in response to a difference between of the rising and falling edges.

10. A circuit for generating a high-resolution periodic waveform, comprising:
   oscillator means for generating a plurality of delayed oscillator signals in response to an error signal;
   a plurality of ANDing means for generating a plurality of intermediate clock signals so that each ANDing means generates one intermediate clock signal, each ANDing means comprising:
      first receiving means for receiving the delayed oscillator signals, and
      first generating means for generating an intermediate clock signal from the delayed oscillator signals received by the first receiving means by passing a single delayed oscillator signal, and by performing a logical AND operation on two or more delayed oscillator signals;
   a plurality of ORing means for generating a plurality of output clock signals so that each ORing means generates one output clock signal, each ORing means comprising:
      second receiving means for receiving one or more intermediate clock signals; and
      second generating means for generating an output clock signal from the one or more intermediate clock signals received by the second receiving means by passing a single intermediate clock signal, and by performing a logical OR operation on two or more intermediate clock signals;
   a plurality of driver means for generating a plurality of clock driver output signals so that each driver means generates one clock driver output signal, each driver means comprising:
      means for receiving one output clock signal, and
      means for generating a clock driver output signal in response to said one output clock signal;
   feedback means for feeding back one of the clock driver output signals as feedback signal; and
   comparison means for generating the error signal by comparing the feedback signal and a reference signal.

11. The circuit of claim 10 wherein the oscillator means comprises a voltage controlled ring oscillator having a ring of gates, each gate corresponding to one of the plurality of delayed oscillator signals.

12. The circuit of claim 11 wherein the phase delay between each adjoining gate in the ring of gates is substantially equivalent.

13. The circuit of claim 11 wherein the plurality of ANDing means and the plurality of ORing means are formed from a logic array.

14. The circuit of claim 12 wherein the plurality of delayed oscillator signals includes 51, 39, 27, or 21 delayed oscillator signals.

15. The circuit of claim 13 wherein the logic array includes a fixed AND/OR logic array.

16. The circuit of claim 12 wherein the phase delay between each gate is determined by the number of gates in the ring and the frequency of the reference signal.

17. The circuit of claim 16 wherein the number of gates in the ring includes any number of odd gates.

18. The circuit of claim 10 wherein one of the driver means further includes:
   means for comparing a rising edge of one output clock signal with a falling edge of another output clock signal; and
   means for adjusting a propagation delay of the remaining driver means in response to a difference between of the rising and falling edges.

19. A method for generating a high-resolution periodic waveform, the method comprising the steps of:
   generating a plurality of delayed oscillator signals in response to an error signal;
   generating a plurality of clock signals, each clock signal being generated by passing a single delayed oscillator signal, and by performing a logical AND operation on two or more delayed oscillator signals;
   generating a clock driver output signal in response to each clock signal;
   feeding back one of the clock driver output signals as a feedback signal; and
   generating the error signal by comparing the feedback signal and a reference signal.

20. The method of claim 19 wherein the plurality of delayed oscillator signals are generated by a voltage controlled ring oscillator having a ring of gates, each gate corresponding to one of the plurality of delayed oscillator signals.

21. The method of claim 20 wherein the phase delay between each adjoining gate in the ring of gates is substantially equivalent.

22. The method of claim 20 wherein the plurality of clock signals are generated by a logic array.

23. The method of claim 22 wherein the plurality of delayed oscillator signals includes 51, 39, 27, or 21 delayed oscillator signals.

24. The method of claim 22 wherein the logic array includes a fixed AND/OR logic array.

25. A method for generating a high-resolution periodic waveform, the method comprising the steps of:
   generating a plurality of delayed oscillator signals in response to an error signal;
   generating a plurality of intermediate clock signals, each intermediate clock signal being generated by passing a single delayed oscillator signal, and by performing a logical AND operation on two or more delayed oscillator signals;
   generating one or more output clock signals, each output clock signal being generated by passing a single intermediate clock signal, and by performing a logical OR operation on two or more intermediate clock signals;
   generating a clock driver output signal in response to each output clock signal;
   feeding back one of the clock driver output signals as a feedback signal; and
   generating the error signal by comparing the feedback signal and a reference signal.

26. The method of claim 25 wherein the plurality of delayed oscillator signals is generated by a voltage controlled ring oscillator having a ring of gates, each gate corresponding to one of the plurality of delayed oscillator signals.

27. The method of claim 26 wherein the phase delay between adjoining gates in the ring of gates is substantially equivalent.

28. The method of claim 26 wherein the plurality of intermediate clock signals and the one or more output clock signals are generated by a logic array.

29. The method of claim 28 wherein the plurality of delayed oscillator signals includes 51, 39, 27, or 21 delayed oscillator signals.

30. The method of claim 28 wherein the logic array includes a fixed AND/OR logic array.

31. A circuit for generating a high-resolution periodic waveform, the circuit comprising:

an oscillator that generates a plurality of delayed oscillator signals in response to an error signal;

a logic array that receives the delayed oscillator signals, that forms a plurality of sets of delayed oscillator signals, and that generates a plurality of clock signals corresponding to the plurality of sets of delayed oscillator signals by passing a delayed oscillator signal when a set of delayed oscillator signals contains a single delayed oscillator signal, and by performing a logical AND operation on the delayed oscillator signals when the set of delayed oscillator signals contain two or more delayed oscillator signals;

a plurality of drivers that generate a plurality of clock driver output signals in response to the plurality of clock signals, each driver receiving one clock signal and generating one clock driver output signal in response to said one clock signal; and a comparator that generates the error signal by comparing one of the plurality of clock driver signals and a reference signal.

32. The circuit of claim 31 wherein the oscillator comprises a voltage controlled ring oscillator having a ring of gates, each gate corresponding to one of the plurality of delayed oscillator signals.

33. The circuit of claim 32 wherein a phase delay between each adjoining gate in the ring of gates is substantially equivalent.

34. The circuit of claim 31 wherein the logic array comprises a fixed AND/OR logic array.

35. The circuit of claim 31 wherein the oscillator generates 51, 39, 27, or 21 delayed oscillator signals.

36. The circuit of claim 31 wherein a phase delay between each delayed oscillator signal which is adjacent in time is substantially equivalent.

37. The circuit of claim 32 wherein the phase delay between each gate is determined by the number of gates in the ring and the frequency of the reference signal.

38. The circuit of claim 32 wherein the number of gates in the ring includes any number of odd gates.

39. The circuit of claim 31 wherein the logic array further includes means for gating an ANDed signal to a driver.

40. A circuit for generating a high-resolution periodic waveform, the circuit comprising:

an oscillator that generates a plurality of delayed oscillator signals in response to an error signal;

a logic array that receives the delayed oscillator signals, that forms a plurality of sets of delayed oscillator signals, that generates a plurality of intermediate clock signals corresponding to the plurality of sets of delayed oscillator signals by passing a delayed oscillator signal when a set of delayed oscillator signals contains a single delayed oscillator signal, and by performing a logical AND operation on the delayed oscillator signals when the set of delayed oscillator signals contain two or more delayed oscillator signals, that forms a plurality of sets of intermediate clock signals, that generates a plurality of output clock signals corresponding to the plurality of sets of intermediate clock signals by passing an intermediate clock signal when a set of intermediate clock signals contains a single intermediate clock signal, and by performing a logical OR operation on the intermediate clock signals when the set of intermediate clock signals contain two or more intermediate clock signals;

a plurality of drivers that generate a plurality of clock driver output signals in response to the plurality of output clock signals, each driver receiving one output clock signal and generating one clock driver output signal in response to said one output clock signal; and a comparator that generates the error signal by comparing one of the plurality of clock driver signals and a reference signal.

41. The circuit of claim 40 wherein the oscillator comprises a voltage controlled ring oscillator having a ring of gates, each gate corresponding to one of the plurality of delayed oscillator signals.

42. The circuit of claim 41 wherein a phase delay between each adjoining gate in the ring of gates is substantially equivalent.

43. The circuit of claim 40 wherein the logic array comprises a fixed AND/OR logic array.

44. The circuit of claim 40 wherein the oscillator generates 51, 39, 27, or 21 delayed oscillator signals.

45. The circuit of claim 40 wherein a phase delay between each delayed oscillator signal which is adjacent in time is substantially equivalent.

46. A circuit for generating a high-resolution periodic waveform, the circuit comprising:

an oscillator that generates a plurality of delayed oscillator signals in response to an error signal;

a logic array that receives the delayed oscillator signals, that forms a plurality of sets of delayed oscillator signals, and that generates a plurality of clock signals corresponding to the plurality of sets of delayed oscillator signals by passing a delayed oscillator signal when a set of delayed oscillator signals contains a single delayed oscillator signal, and by performing a logical AND operation on the delayed oscillator signals when the set of delayed oscillator signals contain two or more delayed oscillator signals; and a comparator that generates the error signal by comparing one of the plurality of clock signals and a reference signal.

* * * * *